US007961067B2

(12) United States Patent
Chiba et al.

(10) Patent No.: US 7,961,067 B2
(45) Date of Patent: Jun. 14, 2011

(54) SUPERCONDUCTING MAGNET APPARATUS AND MAGNETIC RESONANCE IMAGING APPARATUS

(75) Inventors: Tomoo Chiba, Hitachi (JP); Hiroyuki Watanabe, Hitachi (JP); Kunihiro Takayama, Hitachi (JP); Jun Kawamura, Hitachinaka (JP); Mitsushi Abe, Hitachinaka (JP); Takeshi Nakayama, Hitachinaka (JP); Yoshio Hamadate, Hitachiohta (JP)

(73) Assignees: Hitachi, Ltd., Tokyo (JP); Hitachi Engineering & Services Co., Ltd., Ibaraki (JP)

( * ) Notice: Subject to any disclaimer, the term of this patent is extended or adjusted under 35 U.S.C. 154(b) by 0 days.

(21) Appl. No.: 11/780,068

(22) Filed: Jul. 19, 2007

(65) Prior Publication Data

US 2008/0024254 A1   Jan. 31, 2008

(30) Foreign Application Priority Data

Jul. 27, 2006  (JP) ................................ 2006-204105

(51) Int. Cl.
*H01F 1/00* (2006.01)
*H01F 6/00* (2006.01)
*G01V 3/00* (2006.01)
(52) U.S. Cl. ........................ 335/216; 324/318
(58) Field of Classification Search .................. 335/216; 324/318–321
See application file for complete search history.

(56) References Cited

U.S. PATENT DOCUMENTS

| | | | | | |
|---|---|---|---|---|---|
| 5,446,433 | A | * | 8/1995 | Laskaris et al. | 335/216 |
| 5,530,413 | A | * | 6/1996 | Minas et al. | 335/216 |
| 5,574,417 | A | * | 11/1996 | Dorri et al. | 335/216 |
| 5,918,470 | A | * | 7/1999 | Xu et al. | 62/51.1 |
| 5,936,499 | A | * | 8/1999 | Eckels | 335/216 |
| 6,100,780 | A | * | 8/2000 | Dorri et al. | 335/216 |
| 6,289,681 | B1 | * | 9/2001 | Eckels et al. | 62/47.1 |
| 6,570,476 | B1 | * | 5/2003 | Laskaris | 335/216 |
| 6,657,526 | B2 | * | 12/2003 | Nagashima et al. | 335/216 |
| 6,864,770 | B2 | * | 3/2005 | Nemoto et al. | 335/216 |
| 6,967,480 | B2 | * | 11/2005 | Nemoto et al. | 324/318 |
| 7,126,448 | B2 | * | 10/2006 | Watanabe et al. | 335/216 |
| 2005/0077898 | A1 | * | 4/2005 | Nemoto et al. | 324/318 |
| 2006/0022779 | A1 | * | 2/2006 | Jiang et al. | 335/216 |
| 2006/0113995 | A1 | * | 6/2006 | Jarvis et al. | 324/318 |

FOREIGN PATENT DOCUMENTS

| | | |
|---|---|---|
| JP | 10-097917 | 4/1998 |
| JP | 2001-224571 | 8/2001 |
| JP | 2004-275759 | 10/2004 |
| JP | 2005-137530 | 6/2005 |
| JP | 2005-143853 | 6/2005 |
| JP | 2005-144132 | 6/2005 |
| JP | 2005-204964 | 8/2005 |
| JP | 2005-304597 | 11/2005 |
| JP | 2006-034955 | 2/2006 |
| JP | 2006-043426 | 2/2006 |
| JP | 2006-102060 | 4/2006 |

* cited by examiner

*Primary Examiner* — Elvin G Enad
*Assistant Examiner* — Alexander Talpalatskiy
(74) *Attorney, Agent, or Firm* — Mattingly & Malur, PC

(57) ABSTRACT

A superconducting magnet apparatus obtains high magnetic field uniformity without increasing the volume of a magnetic material even against disturbances. The superconducting magnet apparatus has a circular superconducting coil which generates a magnetic field; a coil vessel which contains the superconducting coil 11 together with refrigerant; a thermal shield arranged so as to surround the coil vessel; a vacuum vessel with inside kept vacuum which surrounds the thermal-shield; and magnetic materials and for correcting the magnetic field, the magnetic materials being arranged in the vacuum vessel; wherein the magnetic materials and are supported by a heat-insulation support medium fixed to the coil vessel.

4 Claims, 7 Drawing Sheets

SUPERCONDUCTING MAGNET APPARATUS AND MAGNETIC RESONANCE IMAGING APPARATUS

BACKGROUND OF THE INVENTION

1. Field of the Invention

The present invention relates to a superconducting magnet apparatus and a magnetic resonance imaging (hereinafter referred to as MRI) apparatus using the superconducting magnet apparatus. More particularly, the present invention is concerned with an open-type superconducting magnet apparatus suitable for MRI analysis which does not give a cooped-up feeling to a subject to be inspected and an MRI apparatus using the open-type superconducting magnet apparatus.

2. Description of the Related Art

An MRI apparatus measures an electromagnetic wave emitted by hydrogen atomic nucleus spin according to a phenomenon of nuclear magnetic resonance (hereinafter referred to as NMR) and processes the electromagnetic wave as a signal to make a tomogram of the subject's body based on the hydrogen atomic nucleus density. To measure the electromagnetic wave emitted by hydrogen atomic nucleus spin, it is necessary to generate a uniform magnetic field region having high intensity and high static magnetic field uniformity as a measurement area.

Since the intensity of an electromagnetic field by the electromagnetic wave emitted by hydrogen atomic nucleus spin is proportional to the intensity of the static magnetic field in the uniform magnetic field region, it is necessary to increase the intensity of the static magnetic field in order to improve the resolution of the tomogram. Therefore, a superconducting magnet apparatus is used to generate a static magnetic field with high intensity. Furthermore, in order to eliminate distortion of the tomogram with high definition and high resolution, it is necessary to increase the magnetic field uniformity of the uniform magnetic field region. Then, a magnetic material is arranged in the superconducting magnet apparatus as a method for increasing the intensity of the static magnetic field in the uniform magnetic field region and improving the magnetic field uniformity.

An MRI apparatus, which comprises the magnetic material located in a coil vessel filled with ultracold temperature liquid helium for cooling a superconducting coil, although the magnetic material is generally arranged in the atmosphere at normal temperature, is proposed (for example, in JP-A-2001-224571 and JP-A-10-97917). Furthermore, an MRI apparatus, which comprises the magnetic material located in an intermediate-to-low temperature thermal shield system arranged for surrounding an ultracold temperature coil vessel and for shielding radiant heat from a vacuum vessel, is also proposed (for example, JP-A-2005-144132).

However, when arranging a magnetic material in the atmosphere at normal temperature, it is thought that the following two problems arise.

(1) As the temperature changes with varying room temperature, the magnetic material arranged in the atmosphere at normal temperature expands and contracts resulting in dimensional displacement. It is thought that the magnetic field uniformity changes due to this displacement.

(2) For vibration when a permanent current is applied to a superconducting coil and vibration from outside, a relative displacement between a coil vessel of a superconducting magnet apparatus and a vacuum vessel for storing the coil vessel is unavoidable. In this case, it is thought that, if a magnetic material exists in the atmosphere at normal temperature, a relative displacement arises between the position of the superconducting coil in the coil vessel and the magnetic material resulting in variation of the magnetic field uniformity.

The above-mentioned problems (1) and (2) may be solved by arranging a magnetic material in the coil vessel as proposed in JP-A-2001-224571 and JP-A-10-97917. However, it is thought that the following problems arise in this case.

(3) Since the coil vessel is located in a thermal shield plate in the vacuum vessel, the magnetic material will inevitably deviate from the center axis of the superconducting coil by the gap between the thermal shield plate and the coil vessel and the thickness of the thermal shield plate and the coil vessel. Therefore, the influential sensitivity to the magnetic field on the center axis of the superconducting coil by the magnetic material decreases, making it necessary to increase the volume of the magnetic material in order to increase the sensitivity, resulting in an increase in magnet weight. In some cases, it is thought that acquisition of a required sensitivity becomes difficult even if the volume is increased.

Furthermore, when arranging a magnetic material on a thermal shield plate shown in JP-A-2005-144132, it is thought that the following problem arises.

(4) Since the heat capacity of the thermal shield plate will virtually increase, there arises a problem that an initial cooling process takes time. Furthermore, if a refrigerator for cooling the thermal shield plate stops because of power failure, the temperature of the thermal shield plate and the magnetic material rises. However, it is thought that the temperature of the magnetic material which once went up does not easily decrease and the magnetic field uniformity changes over a prolonged period of time.

SUMMARY OF THE INVENTION

The present invention is intended to solve the above-mentioned problems. It is an object of the present invention to provide a superconducting magnet apparatus and an MRI apparatus which make it possible to obtain high magnetic field uniformity, without increasing the volume of the magnetic material even for room temperature variation, vibration, refrigerator deactivation due to power failure, and other disturbances.

To accomplish the above object, a superconducting electromagnet and an MRI apparatus of the present invention are characterized in that the load of the magnetic material is supported so as to insulate heat from the coil vessel and located in a vacuum inside the vacuum vessel.

In accordance with a thus-configured superconducting electromagnet and MRI apparatus, it is possible to provide a superconducting magnet apparatus and an MRI apparatus which can give high magnetic field uniformity without increasing the volume of the magnetic material even for disturbances.

BRIEF DESCRIPTION OF THE DRAWINGS

Other objects and advantages of the invention will become apparent from the following description of embodiments with reference to the accompanying drawings in which.

DETAILED DESCRIPTION OF PREFERRED EMBODIMENTS

Embodiments of the present invention will be described below in detail with reference to the accompanying drawings as required.

Figure 1:
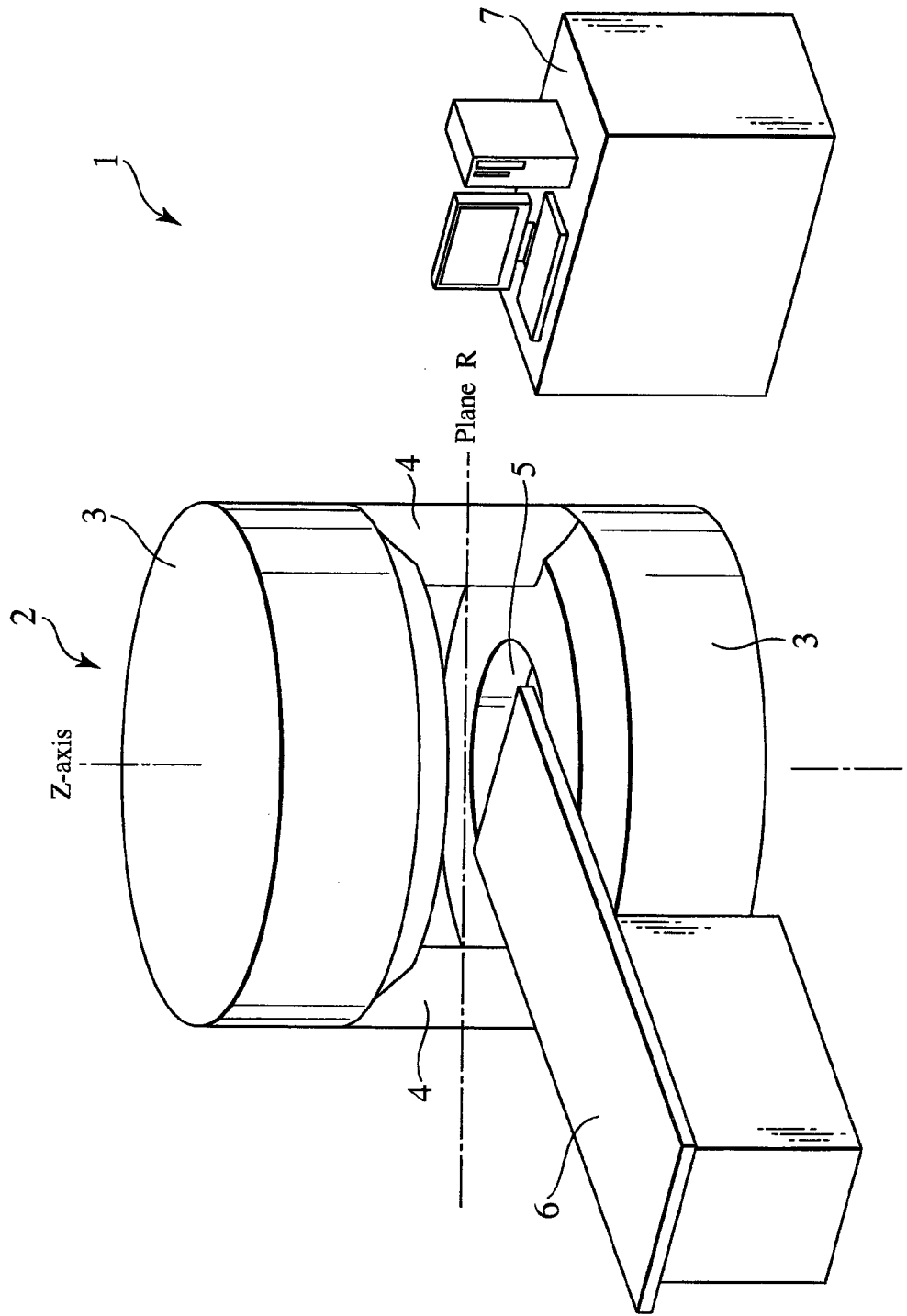
FIG. 1 is a perspective view showing a magnetic resonance imaging apparatus according to a first embodiment of the present invention.

As shown in FIG. 1, an open-type MRI apparatus can be mentioned as an MRI (magnetic resonance imaging) apparatus 1. The open-type MRI apparatus includes a superconducting magnet apparatus 2, a bed 6 for laying out a subject, and a control unit 7. The superconducting magnet apparatus 2 includes two (top and bottom) vacuum vessels 3. Two support member 4 are stuck up on the bottom vacuum vessel 3, and the top vacuum vessel 3 is supported by these support members 4. Since a subject to be inspected is laid down between the top and bottom vacuum vessels 3 spaced apart by the support members 4 to provide medical care, the open-type MRI apparatus provides an open sight and is well-received by subjects. Each of the top and bottom vacuum vessels 3 is a cylindrical tube having the Z axis as a common center axis. Furthermore, the shapes of the top and bottom vacuum vessels 3 are plane symmetry with each other with respect to the R plane having the Z axis as a normal line.

Figure 2:
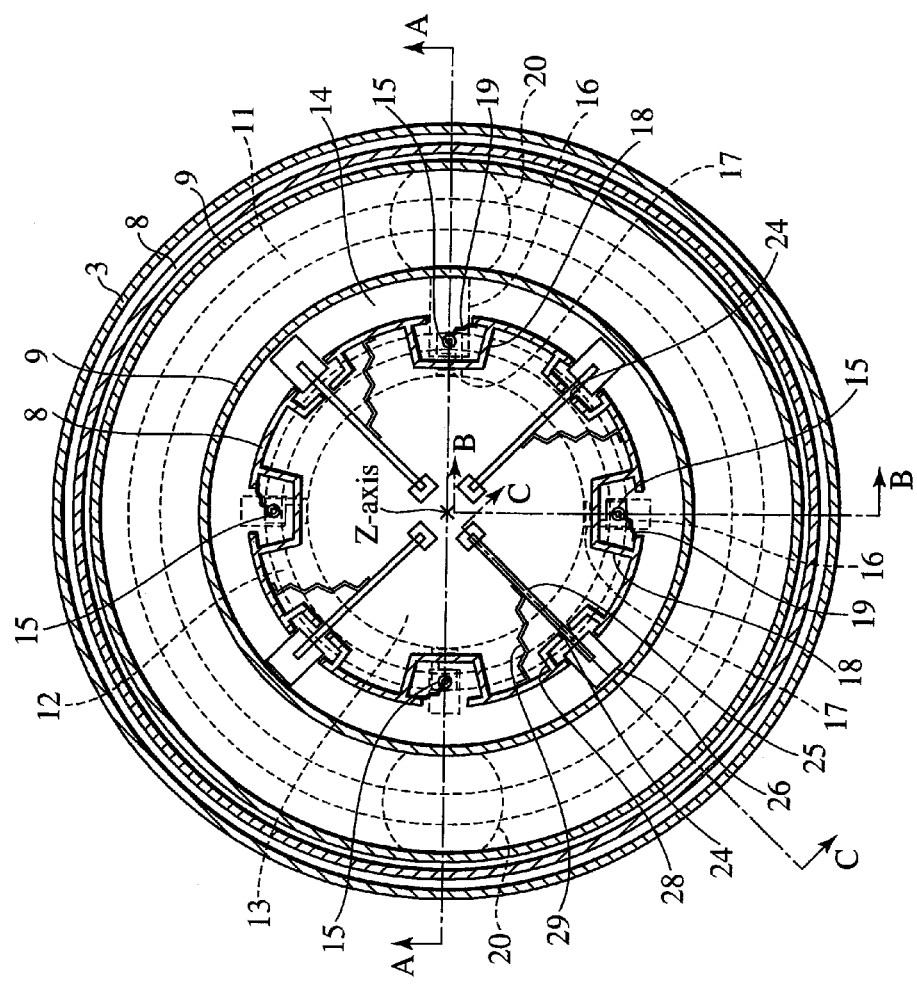
FIG. 2 is a perspective diagram from above a superconducting magnet apparatus according to the first embodiment.
Figure 3:
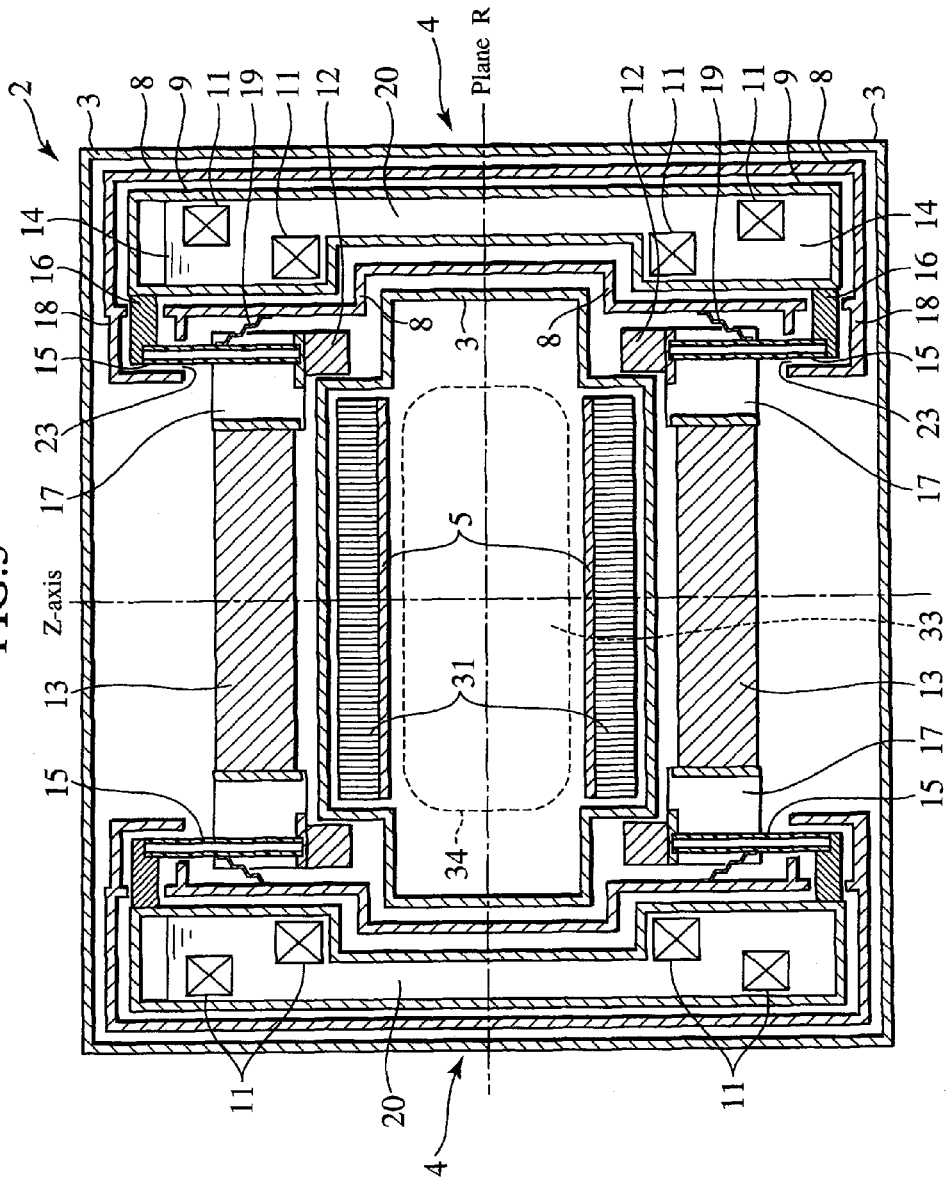
FIG. 3 is a sectional view taken along the A-A line of FIG. 2.

As shown in FIG. 2 and FIG. 3, the superconducting magnet apparatus 2 includes a circularly-arranged superconducting coil 11 which generates a magnetic field by drawing a permanent current for each of the top and bottom vacuum vessels 3 and has a center axis corresponding to the Z axis, a coil vessel 9 which contains the superconducting coil 11 together with refrigerant 14, and a thermal shield 8 arranged so as to surround the coil vessel 9, wherein each of the top and bottom vacuum vessels 3 surrounds the thermal shield 8 to keep the inside vacuum. The refrigerant 14 directly cools the superconducting coil 11. Liquid helium (He) is used as the refrigerant 14. The coil vessel 9 is arranged circularly having the Z axis as a center axis so as to curve along the circularly-arranged superconducting coil 11 to contain it, thus minimizing the capacity. Likewise, the thermal shield 8 is arranged circularly having the Z axis as a center axis so as to curve along the circularly-arranged coil vessel 9 to cover it, thus minimizing the surface area to block heat of immersion.

Even if the superconducting magnet apparatus 2 is arranged in a room at room temperature, the heat in the room is not transferred to the coil vessel 9 through conduction or convection current because the inside of the vacuum vessel 3 is vacuum. Furthermore, the thermal shield 8 is cooled by a refrigerator, absorbs radiant heat from the vacuum vessel 3, and discharges it to the refrigerator. Therefore, the coil vessel 9 is not heated by the radiant heat. It is preferable to set the thermal shield 8 to an intermediate-to-low temperature between the temperature of the refrigerant 14 (ultracold temperature) and the room temperature. The superconducting coil 11 and the coil vessel 9 can be stably set to the ultracold temperature of the refrigerant 14.

Each vacuum vessel 3 includes magnetic materials (ferromagnetic materials for correcting magnetic field) 12 and 13 for correcting a generated magnetic field and forming a uniform magnetic field region (FOV: field of view) 34. The magnetic material 12 is arranged circularly having the Z axis as a center axis, and the outer diameter thereof is smaller than the inner diameter of the superconducting coil 11. The magnetic material 13 is arranged cylindrically having the Z axis as a center axis, and the diameter thereof is smaller than the inner diameter of the magnetic material 12. In this manner, the superconducting magnet apparatus 2 is configured almost in symmetrical structure having the Z axis as a symmetrical axis and the R plane as a symmetrical plane.

The top and bottom vacuum vessels 3 communicate with each other through the support members 4. Likewise, the coil vessel 9 contained in each of the top and bottom vacuum vessels 3 is provided with communication holes 20 so as to communicate with each other through the support members 4.

Furthermore, the thermal shield 8 contained in each of the top and bottom vacuum vessels 3 is connected with each other within the support members 4 so as to cover the periphery of the communication holes 20.

The superconducting coil 11 is supported by the coil vessel 9, and the thermal shield 8 is also supported by the coil vessel 9. The coil vessel 9 having a large total load is supported by the vacuum vessels 3 used as a base.

A radio frequency coil 5 and a gradient coil 31 are located in a recessed section on respective facing side of the top and bottom vacuum vessels 3. The MRI apparatus 1 measures a nuclear magnetic resonance signal emitted by hydrogen atomic nucleus spin according to the NMR phenomenon and processes the nuclear magnetic resonance signal to make a tomogram of the subject's body based on the hydrogen atomic nucleus density. At this time, a static magnetic field, having high intensity (0.2 T or more) and high static magnetic field uniformity, is formed in the field of view 34 in which the subject is laid down. A pair of the top and bottom gradient coils 31 in the field of view 34 applies a gradient magnetic field, having spatially changed magnetic field, to the field of view 34 in order to obtain positional information in the field of view 34. Furthermore, a pair of the top and bottom radio frequency coils 5 in the field of view 34 applies an electromagnetic wave, having a resonance frequency for causing the NMR phenomenon, to the field of view 34. In this manner, by measuring a nuclear magnetic resonance signal emitted by hydrogen atomic nucleus spin for each minute region in the field of view 34 and processing the nuclear magnetic resonance signal, it is possible to make a tomogram of the subject's body based on the hydrogen atomic nucleus density.

Figure 4:
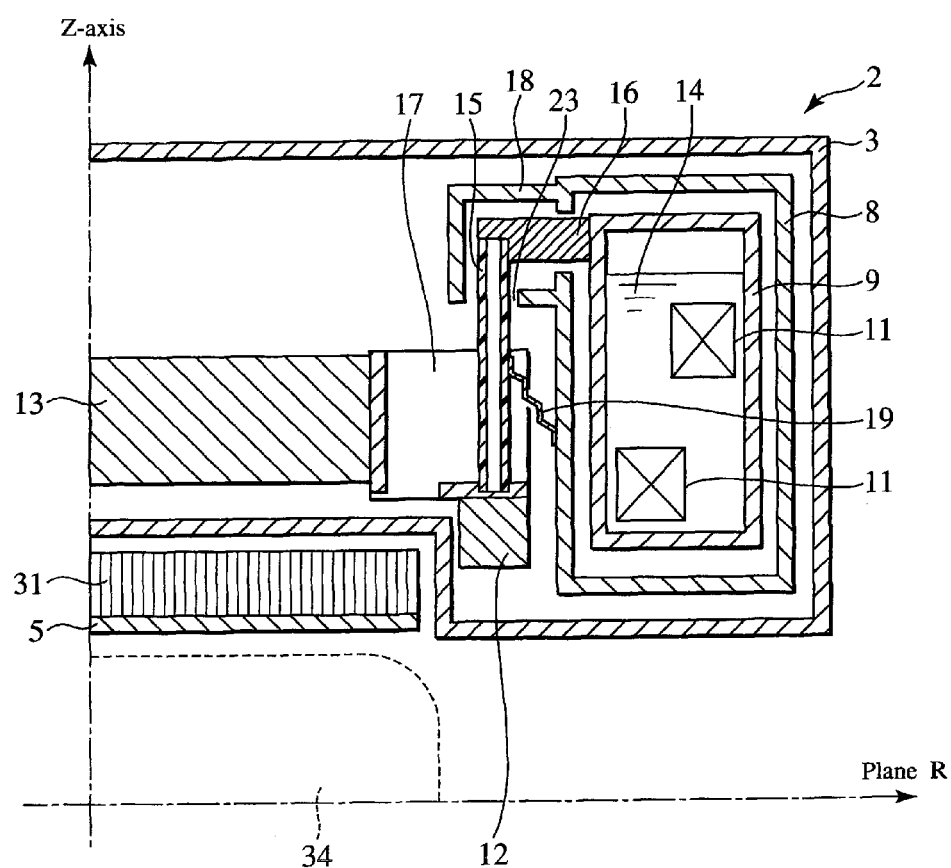
FIG. 4 shows an upper half of the sectional view taken along the B-B line of FIG. 2.

As shown in FIG. 2 to FIG. 4, the magnetic materials 12 and 13 are connected and integrated by a non-magnetic metal connection member 17. The load of the integrated magnetic materials 12 and 13 is supported by the coil vessel 9 through a heat-insulation support medium 15. In order to support the magnetic materials 12 and 13 at room temperature from the coil vessel 9 at liquid helium temperature, the support medium 15 is made of such a material that reduces heat transfer from the magnetic materials 12 and 13 to the coil vessel 9. For example, a fiber-reinforced plastic (FRP) pipe with a low thermal conductivity can be used as the support medium 15. The same function and effect can also be obtained by using a plate- or rod-shaped FRP instead of a pipe-shaped FRP. The support medium 15 is stuck up vertically in parallel with the Z axis. One end of the support medium 15 is fixed to the connection member 17 and the other end to the coil vessel 9 through a non-magnetic metal connection member 16. The connection member 16 connects the support medium 15 and the coil vessel 9. The magnetic materials 12 and 13 are supported by the support medium 15.

By locating the support medium 15 so as to extend through the thermal shield 8, the magnetic materials 12 and 13 are arranged on the outside of the thermal shield 8 and therefore not covered by the thermal shield 8. The thermal shield 8 is provided with a thermal shield cover 18 to cover the connection member 16. The thermal shield cover 18 is provided with a hole 23 and the support medium 15 extends through the hole 23.

Figure 5:
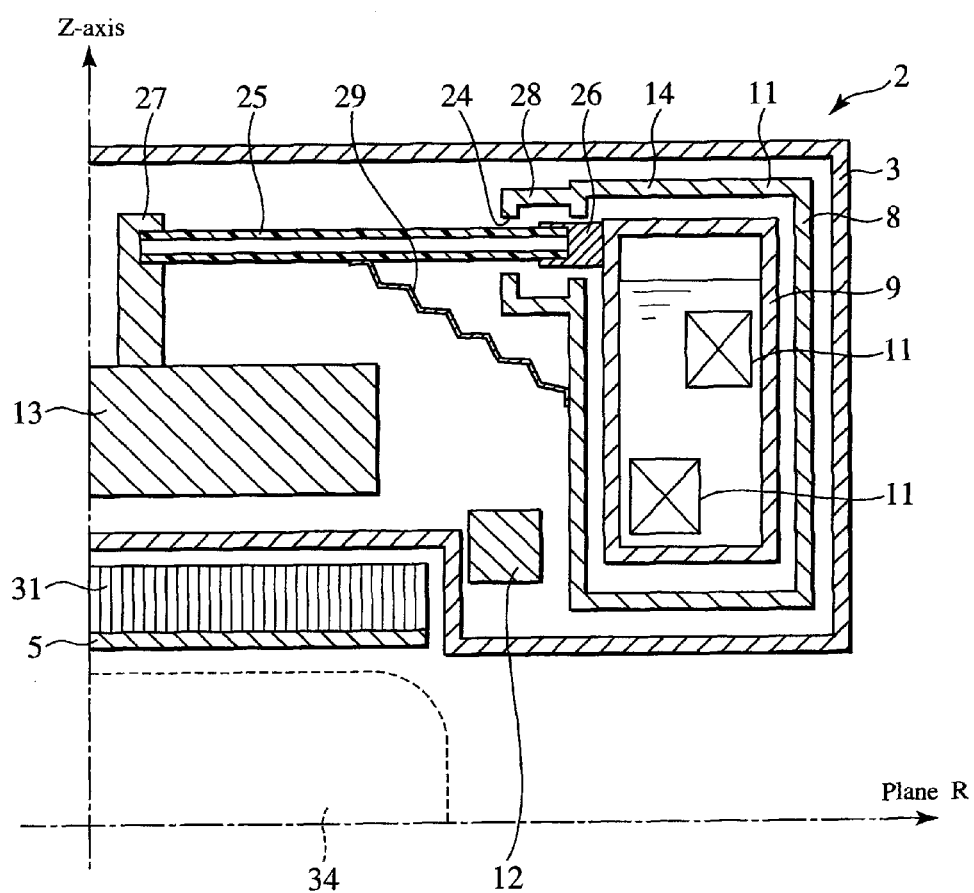
FIG. 5 shows an upper half of the sectional view taken along the C-C line of FIG. 2.

Furthermore, as shown in FIG. 5 illustrating an upper half of a sectional view taken along the C-C line of FIG. 2, the magnetic material 13 is supported by the coil vessel 9 through the heat-insulation support medium 25 in order to suppress movement in a direction perpendicular to a loading direction to the integrated magnetic materials 12 and 13. The support medium 25 is made of a material, such as FRP, which reduces heat transfer from the magnetic materials 12 and 13 to the coil vessel 9 in order to support the magnetic materials 12 and 13 at room temperature from the ultracold temperature coil vessel 9. The support medium 25 may be not only pipe-shaped but also plate- or rod-shaped. The support medium 25 is laid down in the horizontal direction which perpendicularly intersects with the Z axis. One end of the support medium 25 is fixed to a non-magnetic metal connection member 27 fixed to the magnetic material 13, and the other end to the coil vessel 9 through a non-magnetic metal connection member 26. The connection member 26 connects the support medium 25 and the coil vessel 9. The magnetic materials 12 and 13 are supported by the support medium 25 to avoid deflection to the Z axis.

By locating the support medium 25 so as to extend through the thermal shield 8, the magnetic materials 12 and 13 are arranged on the outside of the thermal shield 8 and therefore not covered by the thermal shield 8. The thermal shield 8 is provided with a thermal shield cover 28 to cover the connection member 26. The thermal shield cover 28 is provided with a hole 24 and the support medium 25 extends through the hole 24.

The magnetic materials 12 and 13 are arranged in a vacuum inside the vacuum vessel 3. However, the magnetic materials 12 and 13 are arranged on the outside of the thermal shield 8. Therefore, the temperature of the magnetic materials 12 and 13 becomes almost the same as the room temperature because of radiant heat from the vacuum vessel 3.

Furthermore, since the magnetic materials 12 and 13 are supported so as to insulate heat from the ultracold temperature coil vessel 9, it is possible to maintain the temperature of the magnetic materials 12 and 13 almost at room temperature. At this time, the temperature of the magnetic materials 12 and 13 is not affected by temperature variation of the vacuum vessel 3 due to temporal variation of room temperature because of a large heat capacity of the magnetic materials 12 and 13, leaving positions and dimensions of the magnetic materials 12 and 13 unchanged.

Since the magnetic materials 12 and 13 are not supported by the thermal shield 8, vibration is not transmitted to each other. Therefore, the temperature of the magnetic materials 12 and 13 is not easily changed by temperature variation of the thermal shield 8, positions and dimensions of the magnetic materials 12 and 13 are not easily changed either, and there is no possibility of reduction in the magnetic field uniformity.

Therefore, even if the temperature of the thermal shield 8 rises by refrigerator deactivation due to power failure, variation in the magnetic field uniformity can be suppressed. Furthermore, when quenching the superconducting coil 11, for example, excessive electromagnetic force is applied to the thermal shield 8 resulting in plastic deformation. Even if the position of the thermal shield 8 changes, positional relationship between the superconducting coil 11 and the magnetic materials 12 and 13 remains unchanged and therefore there is no possibility of variation in the magnetic field uniformity after quenching.

Furthermore, even if a current is drawn in the gradient coil 31 and an electromagnetic force is applied to the thermal shield 8 by a generated eddy current resulting in vibration, this vibration is not easily transmitted to the magnetic materials 12 and 13 which are not connected to the thermal shield 8. Therefore, positional relationship between the superconducting coil 11 and the magnetic materials 12 and 13 remains unchanged and there is no possibility of variation in the magnetic field uniformity. In this manner, there is an advantage that it is possible to configure a high-performance MRI apparatus immune to power failure, vibration, and other disturbances.

There is a thermal anchor at a halfway point in the longitudinal direction of the support media 15 and 25, from which heat transfer elastic media 19 and 29 are respectively connected to the thermal shield 8. Although the heat transfer elastic media 19 and 29 cannot mutually support the loads of the support media 15 and 25 and the thermal shield 8 respectively connected to both ends, they conduct heat well and the temperature of the halfway point of the support media 15 and 25 is set to the temperature of the thermal shield 8. This stops heat flow to the ultracold temperature coil vessel 9 caused by heat transfer ranging from room temperature to ultracold temperature from one end to the other of the support media 15 and 25.

In accordance with the embodiment explained above, it becomes possible to reduce magnetic field variation against room temperature variation, vibration, and other disturbances by supporting the load of the magnetic materials 12 and 13 so as to insulate heat from the coil vessel 9 in the vacuum vessel 3, thereby providing a high-performance MRI apparatus.

A second embodiment of the present invention will be described below.

Figure 6:
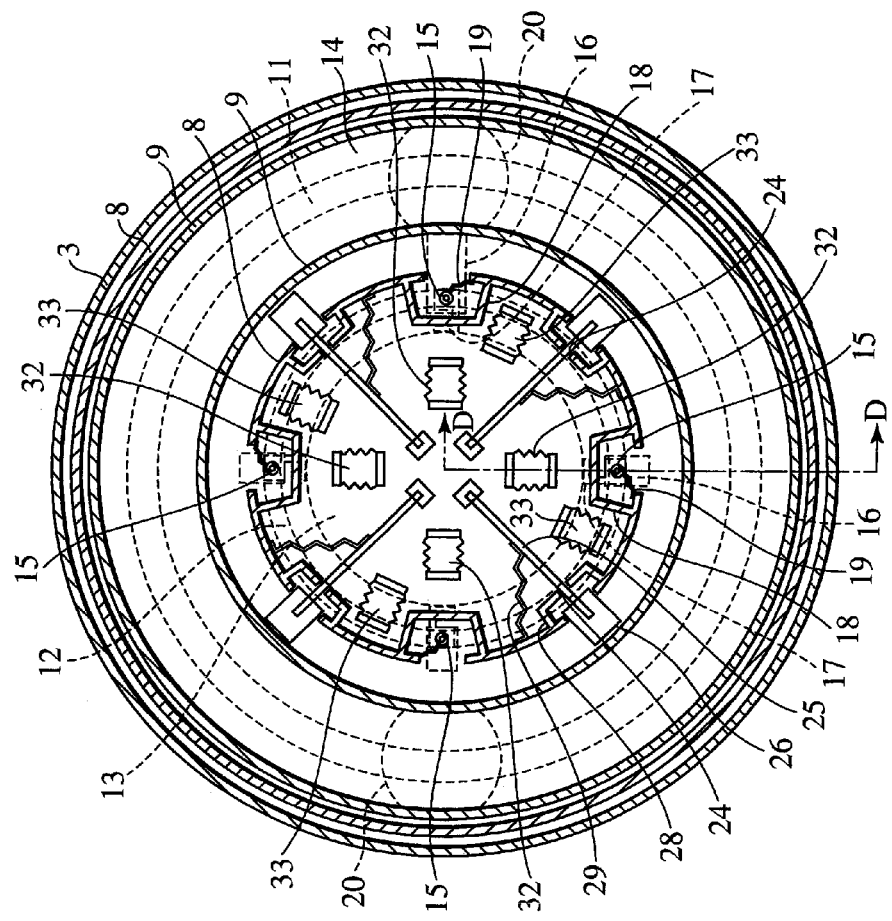
FIG. 6 is a perspective diagram from above a superconducting magnet apparatus of the second embodiment.
Figure 7:
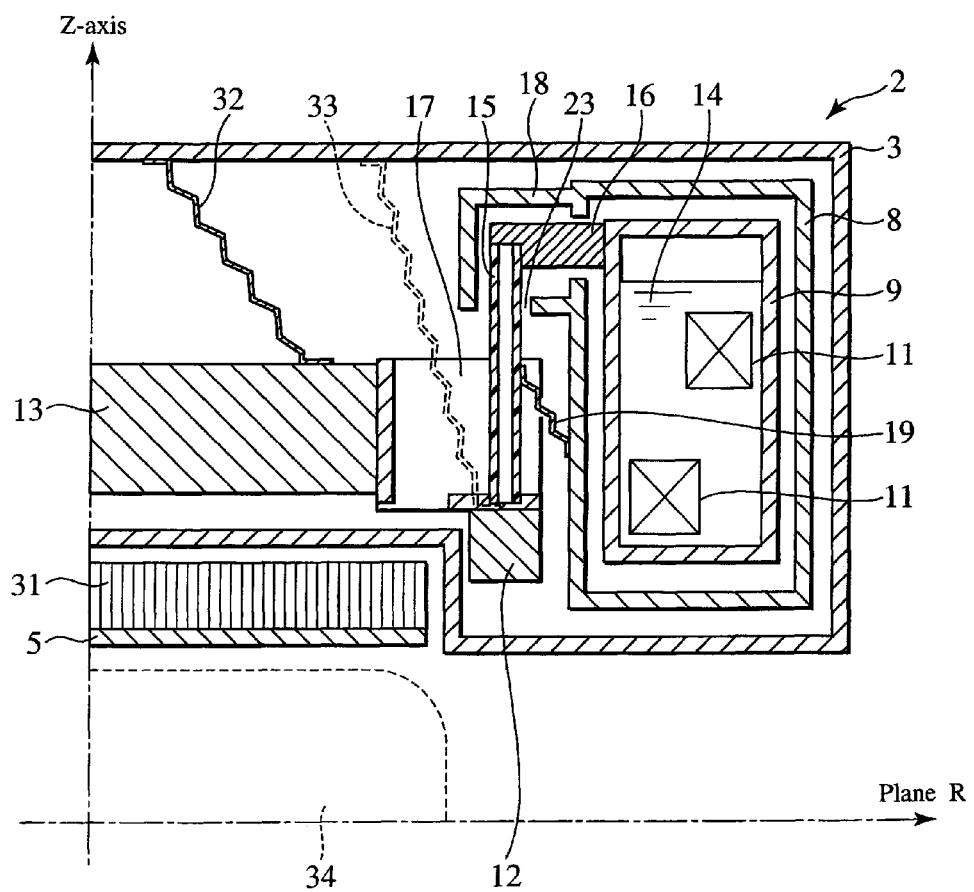
FIG. 7 is a sectional view taken along the D-D line of FIG. 6.

As shown in FIG. 6 and FIG. 7, the second embodiment differs from the first embodiment shown in FIG. 2 and FIG. 4 in that the magnetic materials 12 and 13 are connected with the vacuum vessel 3 through thermal conducting leads 32 and 33, respectively. Although the thermal conducting leads 32 and 33 cannot mutually support the loads of the vacuum vessel 3 and the magnetic materials 12 and 13 respectively connected to both ends, they conduct heat well. This allows heat in the vacuum vessel 3 to transmit to the magnetic materials 12 and 13 not only through radiation but also through conduction of the thermal conducting leads 32 and 33. Therefore, the temperature of the magnetic materials 12 and 13 can be set more quickly almost to the temperature of the vacuum vessel 3, i.e., the room temperature.

However, since the room temperature also fluctuates with a period of one day, it is not desirable that the temperature of the magnetic materials 12 and 13 follows the fluctuation of room temperature. Then, although the magnetic materials 12 and 13 are connected with the vacuum vessel 3 through the thermal conducting leads 32 and 33, respectively, a thermal time constant (time necessary for temperature difference between the vacuum vessel 3 and the magnetic materials 12 and 13 to decrease to 30%) of the thermal conducting leads 32 and 33 is set exceeding one day. This setting makes it possible to stably maintain the magnetic field uniformity because temperature variation of the magnetic materials 12 and 13 does not follow temperature variation of the vacuum vessel 3 caused by the fluctuation of room temperature with a period of one day, thereby providing a high-performance MRI apparatus having high magnetic field stability. The thermal time constant of the thermal conducting leads 32 and 33 can be changed by adjusting the number, the cross-sectional area, and the length of the thermal conducting leads 32 and 33.

On the other hand, with a thermal time constant of the thermal conducting leads 32 and 33 of one week or longer, similarly to the case where the thermal conducting leads 32 and 33 are not arranged, if the temperature of the magnetic materials 12 and 13 largely differs from the room temperature setting, for example, if the temperature of the magnetic materials has risen or fallen compared with the room temperature during transportation of the magnetic materials in an initial activation phase of the superconducting magnet apparatus 2, it takes time until the temperature of the magnetic materials 12 and 13 becomes constant at room temperature, possibly arising a problem that the magnetic field uniformity is left unstabilized for a prolonged period of time. Therefore, it is preferable to adjust the number, the cross-sectional area, and the length of the thermal conducting leads 32 and 33 so that the thermal time constant of the thermal conducting leads 32 and 33 becomes one week or less. In the initial activation phase of the superconducting magnet apparatus 2, on the other hand, the temperature of the magnetic materials 12 and 13 can easily be made constant at room temperature also by presetting the initial temperature of the magnetic materials 12 and 13 to room temperature before transportation.

The thermal conducting leads 32 and 33 are elastic metals having a small elastic modulus. By giving the flexibility to the thermal conducting leads 32 and 33, it is possible to prevent vibration of the magnetic materials 12 and 13 being affected by vibration of the vacuum vessel 3, thus avoiding variation of the magnetic field uniformity. Examples of the thermal conducting leads 32 and 33 include a wire and a thin laminating plate made of copper (Cu) and aluminum (Al).

Also in the second embodiment, since the magnetic materials 12 and 13 are supported so as to insulate heat from the coil vessel 9 in the vacuum vessel 3, magnetic field variation can be reduced against disturbances like the first embodiment. In addition, it is possible to provide a high-performance MRI apparatus wherein the sensitivity to magnetic field variation due to temperature variation can be set low against disturbances and high in the initial activation phase by adjusting the thermal time constant of the thermal conducting leads 32 and 33.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A superconducting magnet apparatus, comprising:
   a circular superconducting coil which generates a magnetic field;
   a coil vessel which contains the superconducting coil together with refrigerant;
   a thermal shield arranged so as to surround the coil vessel;
   a vacuum vessel with the inside thereof kept vacuum, the vacuum vessel surrounding the thermal shield; and
   a cylinder of magnetic material for correcting the magnetic field, the magnetic material being arranged in the vacuum vessel;
   wherein the cylinder of magnetic material is supported by a heat-insulation support medium having a length and width;
   wherein the cylinder of magnetic material is connected with the vacuum vessel through a thermal conducting lead;
   wherein the cylinder of magnetic material is arranged on the outside of the thermal shield;
   wherein the support medium extends through the thermal shield;
   wherein the support medium has one end fixed to the cylinder of magnetic material and the opposite end fixed to the coil vessel and the support medium extends in a direction perpendicular to a z-axis of the apparatus to suppress movement in a direction perpendicular to a loading direction of the cylinder of magnetic material; and
   wherein each end of the support medium includes a non-magnetic metal connection member.

2. The superconducting magnet apparatus according to claim 1, wherein the support medium is connected with the thermal shield through a thermal conducting lead.

3. The superconducting magnet apparatus according to claim 1, wherein a pair of the coil vessels, a pair of the thermal shields, and a pair of the vacuum vessels are arranged so that a pair of the superconducting coils faces each other to form a uniform magnetic field between the vacuum vessels.

4. A magnetic resonance imaging apparatus, comprising the ducting magnet apparatus according to claim 1.

* * * * *